United States Patent [19]

Matsuoka

[11] Patent Number: 5,017,152

[45] Date of Patent: May 21, 1991

[54] SOCKET FOR AN ELECTRIC PART

[75] Inventor: Noriyuki Matsuoka, Tokyo, Japan

[73] Assignee: Yamaichi Electric Mfg. Co., Ltd., Tokyo, Japan

[21] Appl. No.: 453,994

[22] Filed: Dec. 20, 1989

[30] Foreign Application Priority Data

Dec. 27, 1988 [JP] Japan .............................. 63-330607

[51] Int. Cl.$^5$ .......................................... H01R 13/15
[52] U.S. Cl. .................................................. 439/263
[58] Field of Search ............... 439/259, 261, 262, 263, 439/264, 265, 266, 267, 268

[56] References Cited

U.S. PATENT DOCUMENTS

| | | | |
|---|---|---|---|
| 4,331,371 | 5/1982 | Ichimura et al. | 439/266 |
| 4,470,653 | 9/1984 | Coller et al. | 439/266 |
| 4,538,870 | 9/1985 | Thewolis | 439/259 |
| 4,836,798 | 6/1989 | Carter | 439/268 |

Primary Examiner—Joseph H. McGlynn
Assistant Examiner—Hien D. Vu

Attorney, Agent, or Firm—Wenderoth, Lind & Ponack

[57] ABSTRACT

A socket for electric parts has a socket body for connecting an electric part, a moving plate mounted on the socket body and able to horizontally move along an upper surface of the socket body. A contacted state or a noncontacted state between a contact of the socket body and a terminal of the electric part is formed by the horizontal movement of the moving plate in one direction and a noncontacted state between the contact of the socket body and the terminal of the electric part is formed by a horizontal movement of the moving plate in the other direction. The socket for electric parts further has an operating lever for horizontally moving the moving plate in order to form a contacting or a noncontacting state. A lower portion of one end of the operating lever is pivotably connected to a side surface of one end of the socket body, an upper portion of the one end is pivotably connected to a side surface of one end of the moving plate, the other end of the operating lever is made as a free end, and the operating lever is disposed along the side surface of the socket body.

3 Claims, 3 Drawing Sheets

SOCKET FOR AN ELECTRIC PART

BACKGROUND OF THE INVENTION

1. Field of the Invention

This invention relates to a socket for mounting electric parts, and particularly to a mechanism for establishing a contacting state and a noncontacting state in a socket for electric parts such as an IC socket, etc., and more particularly to a mechanism for moving a plate mounted on a socket body adapted to establish the contacting state and noncontacting state.

2. Brief Description of the Prior Art

Japanese Utility Model Laid-open Publication No. Sho 57-175388 discloses means for realizing a contacting relation and a noncontacting relation by horizontally moving a plate along an upper surface of a socket body. This means includes respective pins projecting sidewards from the moving plate and socket body. When the moving plate is placed on the socket body, the pins of the moving plate and the pins of the socket body are aligned in a vertical relation. The means further includes an operating lever provided at one end portion thereof with a U-shaped groove which allows the pins of the moving plate and socket body to be removably inserted therein. In order to establish the contacting relation and the noncontacting relation, the lever, which extends upright astride the socket body, is pivoted in the horizontal direction so that a horizontal force is applied to the pins of the moving plate.

U.S. Pat. No. 4,750,891 attempts to effect the horizontal movement of the moving plate by pivoting a crank lever interposed between the moving plate and the socket body so that an eccentric portion of a crank shaft of the lever acts on the moving plate.

However, in the first mentioned prior art, the operating lever, which extends upright astride the socket body, becomes an obstacle when an electric part such as an IC is mounted or removed. Therefore, there is such an inconvenience in that the operating lever must be mounted or removed every time the moving plate is to be moved or the IC is to be mounted or removed. Moreover, it is necessary to always keep the operating lever nearby which is bothersome.

Furthermore, because the operating lever, which extends upright astride the socket body, is pivoted by a force acting in the horizontal direction in order to move the moving plate, it is practically impossible to pivot the operating lever by simply moving a manipulator of a robot in a vertical direction. Therefore, this prior art is not suitable for automating the moving operation of the moving plate.

In the second mentioned crank lever system, twisting of the crank shaft interposed between the socket body and the moving plate and motion is often not transmitted to the eccentric portion correctly. As a consequence, the moving distance of the moving plate is not constant and an insufficient contacting state can arise.

If the eccentric portion is enlarged to obtain a longer eccentric dimension of the crank shaft in order to in turn obtain a sufficiently long moving distance of the moving plate, the necessary twisting amount is increased. On the contrary, if the eccentric dimension is made small, it is necessary to make the pivotal angle of the crank lever large. If the pivotal angle is made large, the lever must be brought to an upright state and as in the preceding case, it cannot be operated through a vertical motion by a robot or the like. In addition, if there is an obstacle above the socket body, the actuating operation becomes difficult.

The present invention has been accomplished in order to overcome the above-mentioned problems.

SUMMARY OF THE INVENTION

It is therefore a general object of the present invention to provide a socket for electric parts, in which the horizontal movement of the moving plate, i.e., the establishment of the contacting relation and noncontacting relation can be properly performed by an operating lever which is disposed along the socket body without occupying a space above the socket body.

In order to achieve the above object, there is essentially provided a socket for electric parts including a socket body for receiving an electric part, a moving plate mounted on said socket body and able to horizontally move along an upper surface of said socket body, a contacted state or a noncontacted state between a contact of said socket body and a terminal of said electric part being established by the horizontal movement of said moving plate in one direction and a noncontacted state between the contact of said socket body and the terminal of said electric part being formed by a horizontal movement of said moving plate in the other direction, characterized by further including an operating lever for horizontally moving said moving plate in order to establish the contacting or a noncontacting state. A lower portion of one end of said operating lever is pivotably connected to a side surface of said socket body, at one end thereof, and an upper portion of said one end of the operating lever is pivotably connected to a side surface of said moving plate at one end thereof. The other end of said operating lever is a free end, and said operating lever extends along the side surface of said socket body.

When the free end of the operating lever disposed along the side surface of the socket body, and more specifically along the side surface of an overlapped body constituted by the socket body and the moving plate, is pushed down, the operating lever is pivoted downward about a portion thereof pivotally connected to the socket body by a supporting point at the side thereof. In accordance with the pivotal movement of the operating lever, a portion thereof pivotally connected to the moving plate, at the side thereof, is translated about the above-mentioned supporting point and a horizontally moving force is applied to the moving plate. As a consequence, the moving plate is horizontally moved in one direction to establish a contacting state or a noncontacting state. For example, by horizontally moving the moving plate in one direction, a terminal of an electric part inserted into the moving plate is moved from a noncontacted position to a contacted position with respect to a contact held by the socket body. As a result, a contacting state is established. Similarly, by horizontally moving the moving plate in the other direction, the contact is forcefully displaced from its contacted position to a noncontacted position. As a result, the noncontacting state is established.

When the free end of the operating lever is pivoted upward, the operating lever is pivoted upward along the side surface of the socket main body about the portion thereof pivotally connected at the side of the socket body. In accordance with the pivotal movement of the operating lever, the pivotally connected portion of the moving plate is translated about the pivotally connected portion of the socket body, whereby a horizontally moving force is applied to the moving plate in the direction opposite to the above-mentioned direction. As a result, the moving plate is moved in the direction opposite to the above-mentioned direction to establish a contacting state or a noncontacting state. For example, by horizontally moving the moving plate in the other direction, the terminal of an electric part inserted into the moving plate is moved from a contacting position where it engages the contact to a noncontacting position.

Also, owing to a resilient force biasing the moving plate in one direction from a contact opening position to a contact closing position, once the moving plate is forced in the other direction by the operating lever and the terminals are inserted, the operating lever is pivoted from a lower position to an upper position by the resilient force to clamp the terminals in engagement with the contacts.

BRIEF DESCRIPTION OF THE DRAWINGS

The above and other objects of the present invention will be apparent from the following detailed description of the embodiment when read in connection with the accompanying drawings, in which:

FIGS. 9A through 11B show a contacting state and a noncontacting state between contacts and terminals caused by a moving plate according to a modified form of the present invention, FIGS. 9A, B showing a mounting state of an electric part, FIGS. 11A, B showing a noncontacting state, and FIGS. 11A, B showing a contacting state.

DETAILED DESCRIPTION OF THE EMBODIMENT

Figure 1:
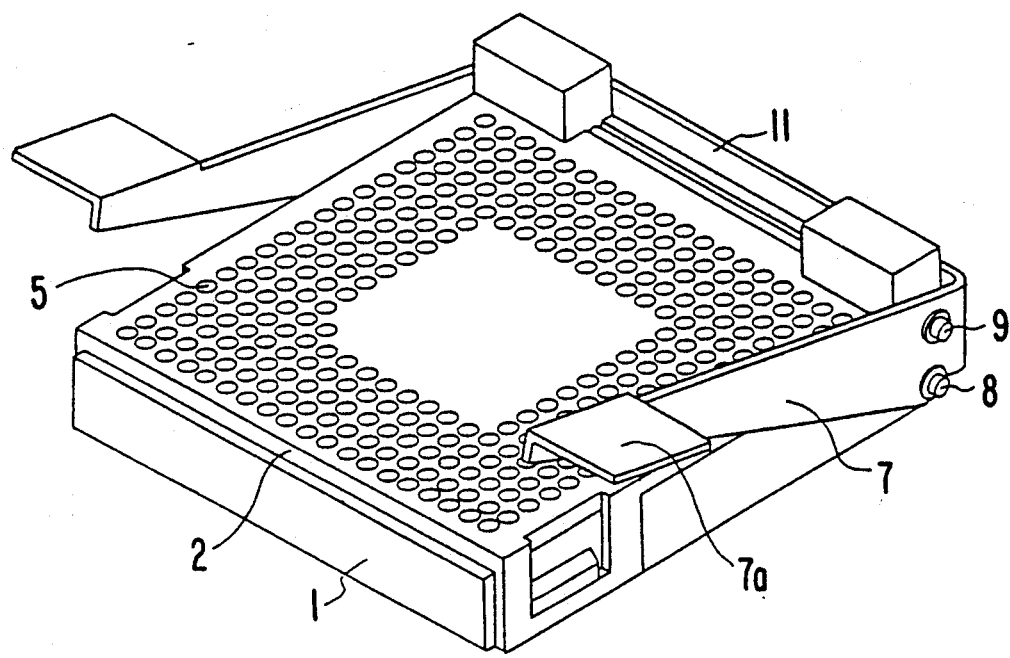
FIG. 1 is a perspective view of a socket according to one embodiment of the present invention wherein the operating lever is in its pushed-up position.
Figure 2:
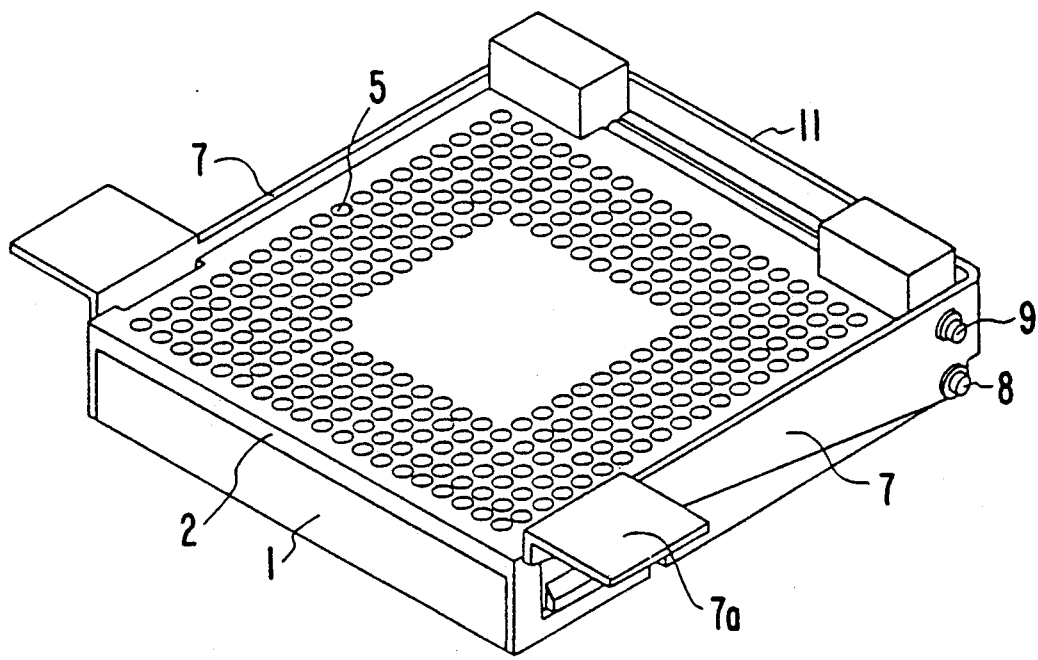
FIG. 2 is likewise a perspective view wherein the operating lever is in its pushed-down position.
Figure 3:
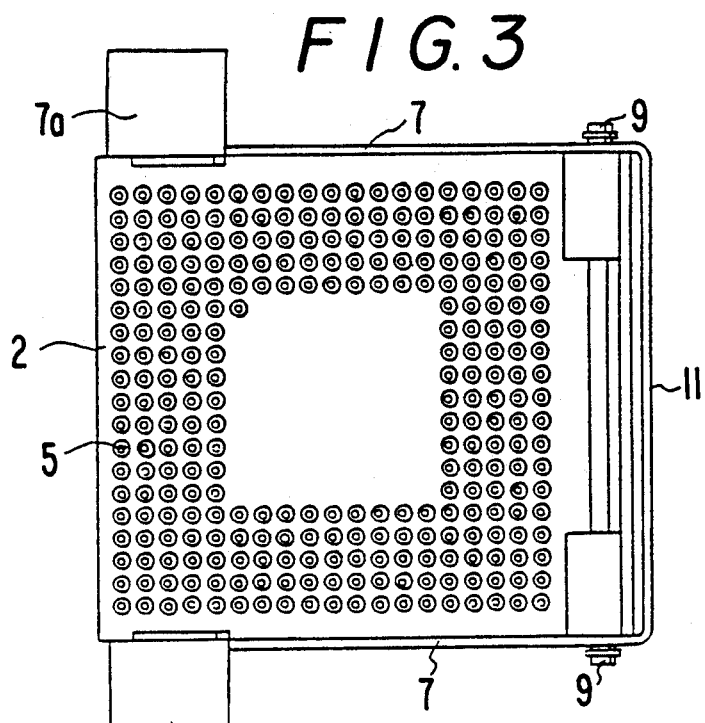
FIG. 3 is a plan view of the socket.

The embodiment of the present invention will be described with reference to FIGS. 1 through 11.

Reference numeral 1 denotes a socket body for an electric part which is to be mounted on a distributing board or the like. The socket body 1 has a plurality of contacts 10 which are arranged to contact a plurality of terminals of an electric part 3. The socket body 1 is provided with a moving plate 2 which is horizontally moved along the upper surface of the socket body 1. The moving plate 2 is horizontally moved in one direction along the upper surface of the socket body 1 to establish one of a contacting state or a noncontacting state between the terminals 4 of the electric part 3 and the contacts 10 of the socket body 1 and is horizontally moved in the other direction to establish the other of the a noncontacting state or contacting state.

Figure 6:
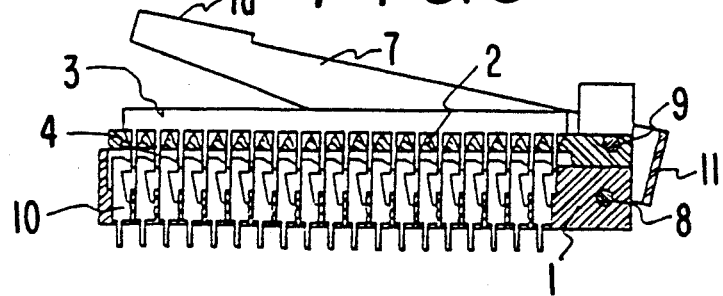
FIGS. 6 through 8 show a contacting state and a noncontacting state established between contacts and terminals by the horizontal movement of a moving plate, FIG. 6 being a side sectional view of the socket in a noncontacting state, FIG. 7 being a similar view showing a contacting state, and FIG. 8 being a plan view showing a relation between the contacts and the terminals in the embodiment.
Figure 7:
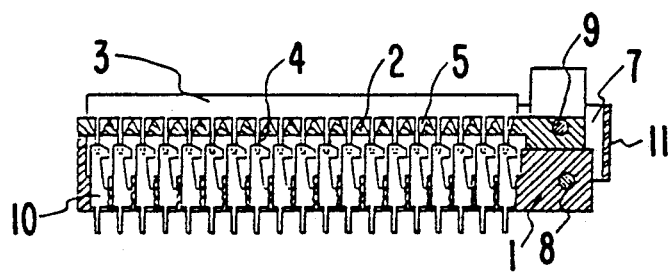
Figure 9:
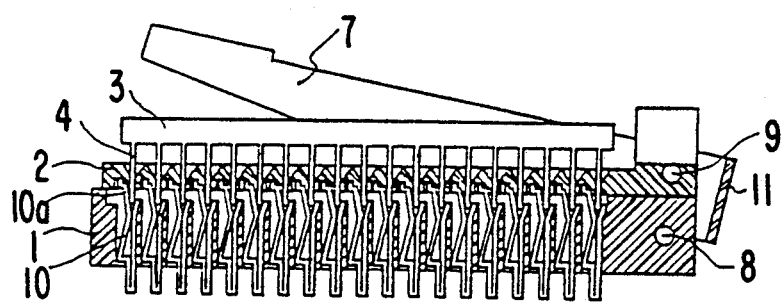
Figure 9:
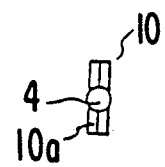
Figure 10:
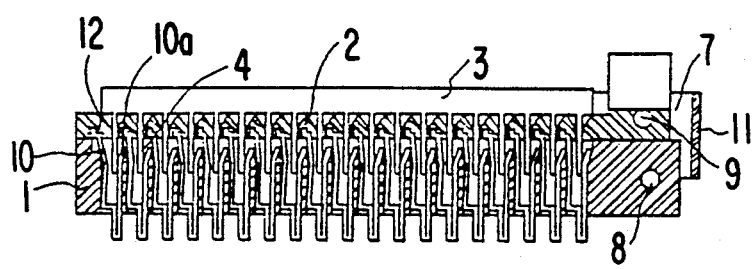
Figure 10:
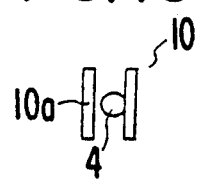

The socket shown in the embodiment is designed such that the moving plate 2 is superposed on the upper surface of the square socket body 1 formed of an insulating material, a plurality of holes 5 adapted to receive the terminals 4 of the electric part 3 are arranged in a matrix shape on the moving plate 2, the electric part 3 such as an IC, etc. is mounted on the upper surface of the moving plate 2, the terminals 4 are inserted into the inserting holes 5, and leading ends of the terminals 4 are inserted into contact accommodating chambers of the socket body 1 corresponding to inserting holes 5. By horizontally moving the moving plate 2 in one direction as shown in FIGS. 6 and 7, the terminals 4 extending through the inserting holes 5 are moved from a noncontacting position (FIG. 6) to a contacting position (FIG. 7) with respect to the normally closed contacts 10 and, by horizontally moving the moving plate 2 in the other direction, the terminals 4 are moved from the contacting position (FIG. 7) to the noncontacting position (FIG. 6). Alternatively, contacting pieces 10a of the contacts 10 holding the electric part terminals 4 are placed in an engaging relation on the lower surface of the moving plate 2 as shown in FIGS. 9 and 10. By horizontally moving the moving plate 2 in one direction, the contacting pieces 10a are displaced against the resilient force exerted thereby to open the contacts 10, or by horizontally moving the moving plate 2 under the restoring force of the contacting pieces 10a acting in the other direction, the contacts 10 are closed.

An operating leverr 7 is provided as means for horizontally moving the moving plate 2 in one direction or in the other direction.

A lower portion of one end of the operating lever 7 is pivotably connected to a side surface of the socket body 1, at one end thereof, by a supporting shaft 8, and an upper portion of one end of the operating lever 7 is pivotally connected to a side surface of the moving plate 2, at one end thereof, by a transmission shaft 9. The transmission shaft 9 is adapted to apply a horizontal moving force to the moving plate 2 when the operating lever 7 is pivoted about the supporting shaft 8.

The operating lever 7 is designed to extend from the pivotally connected portions to the other end of the socket body 1 along the side surfaces of the socket body 1 in such a manner as to be able to move up and down over the side surfaces. The operating lever 7 has a free end comprising a push-down operatin portion 7a and this push-down operating portion 7a serves as a receiving point of force.

As another example of the pivotal connection of the operating lever 7, a lower portion of one end of the operating lever 7 is pivotably supported at the side of one end of the socket body 1 by the supporting shaft 8. One of the operating lever 7 and the moving plate 2 is provided with a U-shaped groove while the other of the lever 7 and plate 2 is provided with a slider extending in the U-shaped groove. When the contacting operating lever 7 is pivoted about the supporting shaft 8, a horizontal moving force is applied to the moving plate 2 via the slider. The supporting shaft 8 may be replaced with the structure constituted by the U-shaped groove and the slider contrary to the structure mentioned above.

As described above, one end of the operating lever 7 is pivotally connected to the side surfaces of the socket body 1 and the moving plate 2, at corresponding ends thereof. The lever extends along side surfaces of the socket body 1 to a free end of the lever 7 disposed at the other end of the socket body 1. Also, the operating lever 7 is arranged in such a manner as to have a pair of lever portions extending in a symmetric relation along two opposite side surfaces of the socket body 1, the end of the connecting portion of the operating lever 7 being connected to a connecting plate 11 extending along the one end of the socket body 1. The lever portions may be connected at the push-down operating portion 7a.

The operation will be described next with reference to FIGS. 4 through 8.

Figure 4:
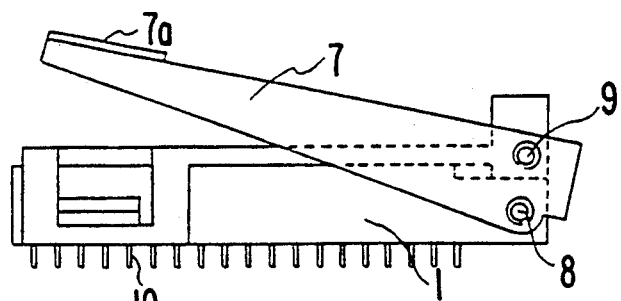
FIG. 4 is a side view of the socket corresponding to FIG. 1.
Figure 5:
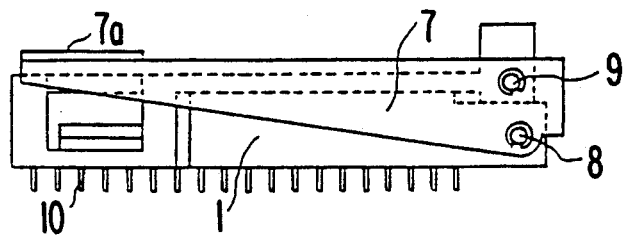
FIG. 5 is a side view of the socket corresponding to FIG. 2.
Figure 8:
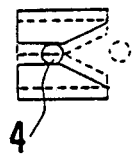

When the push-down operating portion 7a of the contacting operating lever 7 is pushed down from an upper position shown in FIGS. 4 and 6 to a lower position shown in FIGS. 5 and 7, the operating lever 7 is pivoted in the counterclockwise direction (downward) about the supporting shaft 8. In accordance with the pivotal movement of the operating lever 7, the transmission shaft 9 is translated in the counterclockwise direction about the supporting shaft 8. In accordance with the pivotal movement of the transmission shaft 8, a moving force is applied to the moving plate 2 from the righthand side to the left-hand side in the drawing. As a result, the moving plate 2 is horizontally moved in one direction. As a result, the terminals 4 of the electric part 3 mounted on the moving plate 2 are horizontally moved from a noncontacting position to a contacting position with respect to the contacts 10 and the contacts 10, which are normally in the closed state shown by the solid line of FIG. 8, are forcefully opened by the terminals 4 against the resilient force thereof so as to establish a contacted state.

On the contrary, when the operating portion 7a of the operating lever 7 is pushed up from a push-down position shown in FIG. 5 to an upper position shown in FIG. 4, the operating lever 7 is pivoted in the clockwise direction about the supporting shaft 8. In accordance with the pivotal movement of the operating lever 7, the transmission shaft 9 is translated in the clockwise direction (upward) about the supporting shaft 8. In accordance with the pivotal movement of the transmission shaft 9, a moving force is applied to the moving plate 2 from the left-hand side to the right-hand side in the drawing. As a result, the moving plate 2 is horizontally moved in the other direction. As a result, the terminals 4 of the electric part 3 mounted on the moving plate 2 are horizontally moved from a contacting position shown in FIG. 7 to a noncontacting position shown in FIG. 6 with respect to the contacts 10 thereby moving out of engagement with the contacts as shown by the broken lines of FIG. 8.

Figure 11:
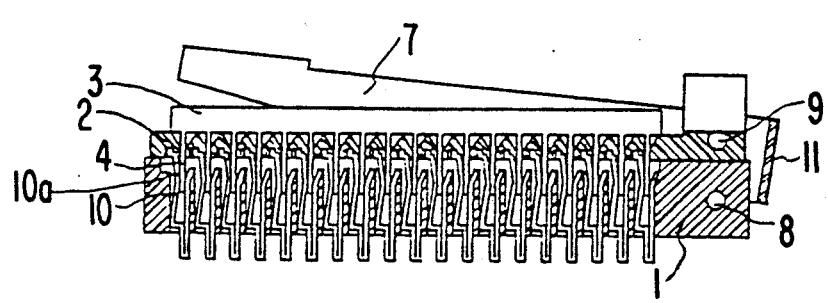
Figure 11:
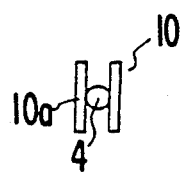

The operation of the embodiment shown in FIGS. 9 through 11 will be described next. The electric part 3 is mounted on the moving plate 2 as shown in FIG. 9(A), and the terminals 4 are inserted into the inserting holes 5 and placed on an entrance of each of the contacts 10 which are in a normally closed state as shown in FIG. 9(B). In the foregoing state, when the operating portion 7a provided on the free end of the operating lever 7 is pushed down from the upper position of FIG. 4 to the lower position of FIG. 5, the moving plate 2 is horizontally moved from the right-hand side to the left-hand side in the drawing. In accordance with the horizontal movement of the moving plate 2, the contacting piece 10a of the normally closed contact 10, which is engaged with the engaging portion 12 of the moving plate 2, is brought to an opened state against the resilient force. As a result, the terminals 4 of the electric part 3 are loosely inserted between the resilient contacting pieces of the contacts 10.

Then, when the pushing down force to the operating lever 7 is relieved, the contacting pieces 10a of the contacts 10 are restored in the closing direction as shown in FIGS. 11(A) and 11(B) to resiliently hold the terminals 4. At the same time, the restoring force of the contacting pieces 10a is applied to the engaging portion 12 of the moving plate 2 to automatically horizontally move the moving plate 2 from the left-hand side to the right-hand side in the drawing. This moving force (restoring force) of the moving plate 2 is applied to the transmission shaft 9. As a result, the operating lever 7 is pivoted from the lower position to the upper position along the side surface of the socket body 1 to assume a pushed-down waiting state.

As described in the foregoing, the socket for electric parts according to the present invention has an operating lever that does not occupy an upper space of the socket body but which extends along the side surfaces of the socket body. By pushing down the free end of the operating lever, the moving plate pivotally connected to an upper portion of the end of the operating lever is horizontally moved in one direction about the lower portion of the end of the operating lever pivotally connected to the socket body to establish a contacting state or a noncontacting state properly and surely.

According to the present invention, the problems associated with twisting, irregular moving distance and insufficient contact caused by the twisting which frequently occur when a crank lever is used as a means for moving the moving plate, are solved a sufficient moving distance of the moving plate can be obtained with a small pushing down force to establish a contacting position or a noncontacting position properly, the operating portion for moving the moving plate is not disposed directly above the moving plate and therefore the electric part is not interfered with by the operating portion when the electric part is mounted and removed, and by simply pivoting the operating lever extending along the side surface of the socket body upward and downward, the above-mentioned contacting state and noncontacting state can be realized. Therefore, the socket for electric parts of the present invention is suitable for facilitating automation using robots, etc.

It will be appreciated that various modifications and changes of the preferred embodiments, some of which have been described above, may be made without departing from the scope of the present invention as defined in the appended claims.

What is claimed is:

1. A socket for supporting an electric part having at least one terminal, said socket comprising:

a socket body having opposite ends, a side surface extending between said ends, an upper surface, and at least one electrical contact;

a movable plate mounted to said socket body on the upper surface thereof and adapted to receive an electric part having at least one terminal, said movable plate having opposite ends and a side surface extending between the ends thereof, said movable plate slidable relative to said socket body in opposite directions, extending between the ends of said socket body along said upper surface thereof, between a contacting position at which the at least one terminal of an electric part when received by said movable plate contacts the at least one contact of said socket body and a noncontacting position at which the at least one terminal of an electric part when received by said movable plate is out of contact with the at least one contact of said socket body;

an operating lever connected to said socket body and to said movable plate for mounting said movable plate to said socket body, and operable to move said movable plate from said contacting position to said noncontacting position, said operating lever having one end including both an upper portion pivotally connected to said movable plate and a lower portion pivotally connected to said socket body a free end, and at least one lever portion extending, in a direction between the ends of said socket body, alongside the side surface of said socket body from said one end of the operating lever to said free end thereof;

transmission shaft means for pivotally connecting said one end of said operating lever, at the upper portion thereof, to the side surface of said movable plate at one of the ends thereof; and supporting shaft means for pivotally connecting said one end of said operating lever, at the lower portion thereof, to the side surface of said socket body at one of the ends thereof.

2. A socket as claimed in claim 1 wherein the side surface of said socket body is constituted by two opposite side surfaces, and said at least one lever portion comprises two lever portions extending alongside the two opposite side surfaces of said socket body, respectively.

3. A socket as claimed in claim 2, wherein said operating lever further comprises a connecting plate extending between and connecting said lever portions at respective corresponding ends thereof.

* * * * *